(12) United States Patent
Kono

(10) Patent No.: US 7,816,281 B2
(45) Date of Patent: Oct. 19, 2010

(54) METHOD FOR MANUFACTURING A SEMICONDUCTOR DEVICE

(75) Inventor: Motoyuki Kono, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 199 days.

(21) Appl. No.: 12/076,406

(22) Filed: Mar. 18, 2008

(65) Prior Publication Data

US 2008/0242107 A1 Oct. 2, 2008

(30) Foreign Application Priority Data

Mar. 19, 2007 (JP) .............................. 2007-069994

(51) Int. Cl.
*H01L 21/31* (2006.01)
(52) U.S. Cl. .................. 438/775; 438/763; 438/791; 438/E21.267; 438/E21.293
(58) Field of Classification Search ................ 438/763, 438/791, 775; 257/E21.267, 21.293
See application file for complete search history.

(56) References Cited

U.S. PATENT DOCUMENTS

| 2008/0119057 A1* | 5/2008 | Chua et al. .................. 438/763 |
| 2008/0214017 A1* | 9/2008 | Murakawa et al. .......... 438/778 |
| 2009/0258505 A1* | 10/2009 | Takahashi .................... 438/762 |

FOREIGN PATENT DOCUMENTS

JP 2004-6455 1/2004

* cited by examiner

*Primary Examiner*—Dung A. Le
(74) *Attorney, Agent, or Firm*—McGinn IP Law Group, PLLC

(57) ABSTRACT

A method for manufacturing a semiconductor device includes the steps of forming a silicon oxide film on a silicon substrate, and forming a silicon nitride film on the silicon oxide film. The step of forming the silicon nitride film includes the steps of growing a first silicon layer having a thickness larger than a thickness of a monoatomic silicon layer, nitriding the first silicon layer to form a first silicon nitride layer, growing a second silicon layer on the first silicon layer on the first silicon nitride layer, and nitriding the second silicon oxide layer to form a second silicon nitride layer.

16 Claims, 7 Drawing Sheets

METHOD FOR MANUFACTURING A SEMICONDUCTOR DEVICE

This application is based upon and claims the benefit of priority from Japanese patent application NO. 2007-069994, filed on Mar. 19, 2007, the disclosure of which is incorporated herein in its entirety by reference.

BACKGROUND OF THE INVENTION

1. Field of the Invention

The present invention relates to a method of manufacturing a semiconductor device by using an ALD (atomic layer deposition) technique and, more particularly, to a method of forming a gate insulation film on a silicon substrate of a semiconductor device by using an ALD technique.

2. Description of the Related Art

A MISFET (metal-insulator-semiconductor field-effect-transistor) includes a gate electrode which is formed on a silicon substrate via a gate insulation film, and a pair of impurity diffused regions, which are formed adjacent to the gate electrode and in a surface portion of the silicon substrate. For instance, silicon oxide is used for the gate insulation film, and impurity-doped polycrystalline silicon (polysilicon) is used for the gate electrode for the purpose of avoiding reaction with the silicon substrate or the gate insulation film. For a P-channel MISFET, for example, boron is used as the impurities doped in the diffused regions.

There has been a requirement of semiconductor devices including therein MISFETs to reduce the thickness of the gate insulation film so as to achieve lower power dissipation. However, if the gate insulation film made from silicon oxide is reduced in thickness, boron which is doped in the gate electrode may be diffused through the gate insulation film during an activation treatment thereof, to thereby reach the silicon substrate. The boron which has reached the silicon substrate may cause a significant fluctuation of the threshold value of the MISFETs to degrade the characteristics of the MISFETs, which should be avoided.

On the other hand, a method has been implemented, in which nitrogen is contained in the gate insulation film for the purpose of avoiding the diffusion of the boron therethrough toward the silicon substrate, and also reducing the thickness of the gate insulation film. The nitrogen contained in the gate insulation film raises the dielectric constant of the gate insulation film, and restrains the boron from diffusing and penetrating through the gate insulation film toward the silicon substrate.

In the process of forming the gate insulation film containing nitrogen, it is desired to prevent the diffusion of the nitrogen in the vicinity of the interface between the silicon substrate and the gate insulation film. This is because the nitrogen which has reached the vicinity of the interface causes vacancy defects in the silicon substrate, to raise the problem of various characteristic degradations in the MISFETs, such as reduction in the mobility of carriers.

There is also a known technique for forming a gate insulation film having a two layer structure, which is used for the purpose of avoiding the diffusion of nitrogen toward the vicinity of the interface with the silicon substrate. The two-layer structure of the gate insulation film is obtained by forming, on the silicon substrate, a silicon oxide film and a silicon nitride film in this order.

For the process of forming two-layer gate insulation film, in the view point of improving the reliability of the gate insulation film, there has been an attempt to form a silicon nitride layer by an ALD technique. The ALD technique is such that a target film of a desired thickness is formed by repeatedly depositing a layer of the target material having a thickness of monoatomic level.

FIGS. 7A and 7B show the steps of forming the silicon nitride film by using the ALD technique. In the process for forming the silicon nitride film by using the ALD technique, two steps are alternately and repeatedly carried out, one being the step of depositing a monoatomic silicon layer 23 by using a Si (silicon) source gas, as shown in FIG. 7A, and the other being the step of nitriding the monoatomic silicon layer 23 by using plasma of a N (nitrogen) source gas, as shown in FIG. 7B, to form a silicon nitride layer 24 having an monoatomic-level thickness. These steps iterated for a number of times finally provide a silicon nitride film having a desired film thickness.

In the process of the ALD technique, a film of a desired thickness is formed by repeating deposition of the layer having a monoatomic-level thickness, and is precisely controlled with respect to the film quality. Therefore, it is possible to form a high-quality film which is sufficient in controllability of the thickness and composition of the film as well as in the in-plane uniformity thereof. Further, since the deposition can be performed at a relatively low process temperature, the range of variation in the impurity profile of the film can be suppressed. Patent Publication JP-2004-006455A, for example, describes a fabrication method of a semiconductor device including the step of forming a silicon nitride film by using the ALD technique, in order to form a two-layer gate insulation film configured by a silicon oxide film and the silicon nitride film.

It is known in the process of depositing the silicon nitride film by using the ALD technique that a plurality of island silicon nitride layers 24a are first formed, as shown in FIG. 8, and then the island silicon nitride layers 24a are eventually allowed to couple together and form the continuous silicon nitride layer 24, as shown in FIG. 7B. In the process step shown in FIG. 8, the silicon oxide film 13, which is in general likely to diffuse nitrogen therethrough, is exposed to the ambient and thus directly nitrided. Therefore, there occurs the problem that a large quantity of nitrogen diffuses through the silicon oxide film 13, reaching the vicinity of the interface between the silicon substrate 11 and the silicon oxide film 13.

In order to suppress the diffusion of the nitrogen toward the vicinity of the interface between the silicon substrate 11 and the silicon oxide film 13, it may be considered to use a lower process temperature during the nitriding of the silicon oxide film 13, a lower flow rate of the N-source gas and/or a smaller time length for exposure of the wafer to the N-source gas in the nitriding step, to thereby suppress nitriding of the underlying silicon oxide film. However, in any of those known countermeasures, another problem is caused that a sufficient amount of nitrogen is not supplied in the silicon nitride film, thereby weakening the Si—N bonding strength therein, which causes an insufficient ability of the film for suppressing the diffusion of boron therethrough.

SUMMARY OF THE INVENTION

The present invention has been made in view of the foregoing problems and it is therefore an object of the present invention to provide a method for manufacturing a semiconductor device which includes a gate insulation film having a two-layer structure including a silicon oxide film and a silicon nitride film, wherein it is possible to prevent boron in the gate electrode from diffusing toward the silicon substrate, and at the same time, prevent nitrogen from diffusing toward the vicinity of the interface between the silicon substrate and the gate insulation film.

The present invention provides a method for manufacturing a semiconductor device including: forming a silicon oxide film on a silicon substrate; and forming a silicon nitride film on the silicon oxide film, wherein the silicon nitride film forming consecutively includes: a first step of growing a first silicon layer having a thickness larger than a thickness of a monoatomic silicon layer; a second step of nitriding the first silicon layer to form a first silicon nitride layer; a third step of growing a second silicon layer on the first silicon nitride layer, the second silicon layer having a thickness substantially equal to the thickness of the monoatomic silicon layer, and a fourth step of nitriding the second silicon layer to form a second silicon nitride layer.

The above and other objects, features and advantages of the present invention will be more apparent from the following description, referring to the accompanying drawings.

DETAILED DESCRIPTION OF THE INVENTION

Figure 1:
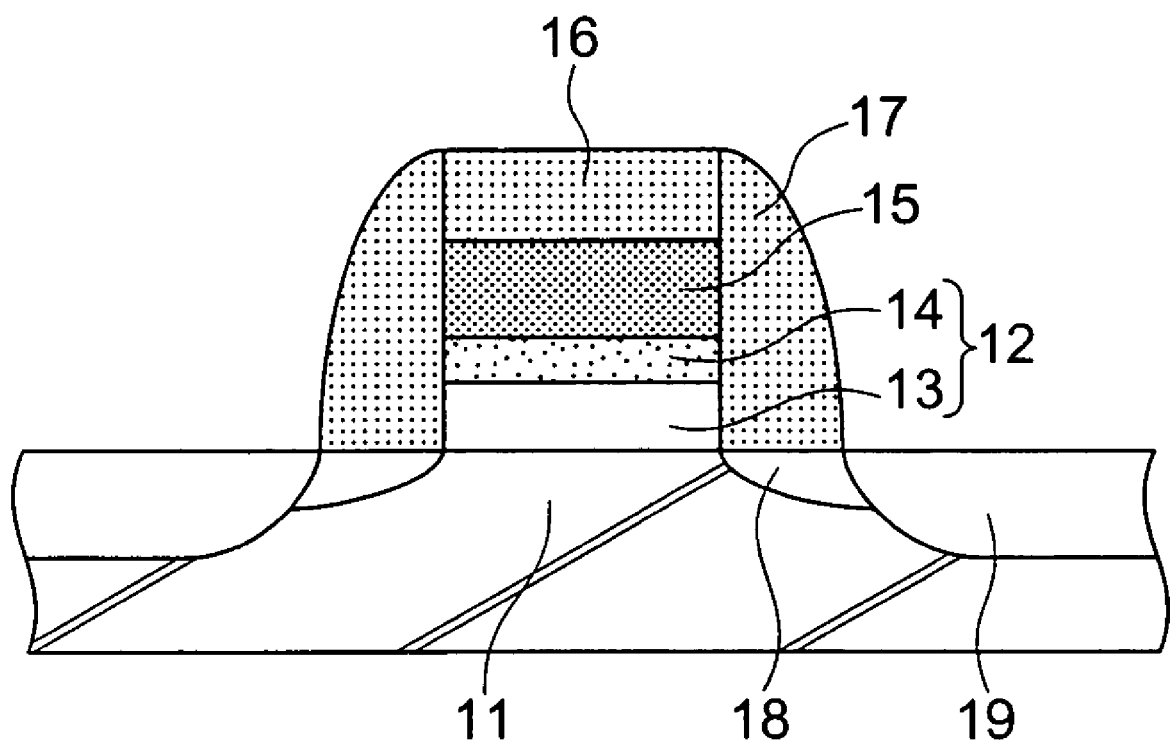
FIG. 1 is a sectional view of a semiconductor device manufactured by a method according to an embodiment of the present invention.

Hereinafter, an exemplary embodiment of the present invention will be described in more detail with reference to the accompanying drawings. FIG. 1 is a sectional view showing the configuration of one of P-channel MISFETs formed in a semiconductor device, which is manufactured by a method for fabricating the semiconductor device according to the embodiment of the invention. The semiconductor device, generally designated at numeral 10, includes a silicon substrate 11, and a MISFET including a gate electrode 15 formed on the silicon substrate 11 with a gate insulation film 12 interposed therebetween.

The gate insulation film 12 has a two-layer structure configured by a silicon oxide film 13 and a silicon nitride film 14, which are consecutively layered on the silicon substrate 11. The gate electrode 15 is made from boron-doped polysilicon. A mask insulation film 16 is formed on top of the gate electrode 15. Both the gate insulation film 12 and gate electrode 15 are patterned by using the mask insulation film 16 as an etching mask.

A sidewall insulation film 17 is formed along each sidewall of the gate insulation film 12, gate electrode 15 and mask insulation film 16. A pair of lightly-doped diffused regions 18 are formed in a surface portion of the silicon substrate 11 adjacent to the gate electrode 15. A pair of heavily-doped diffused regions 19 are formed in the outer regions of the lightly-doped diffused regions 18 and in a surface portion of the silicon substrate 11 adjacent to the sidewall insulation films 17. The heavily-doped diffused regions 19 have a depth larger than the depth of the lightly-doped diffused regions 18.

The MISFET are each configured by the gate electrode 15, gate insulation film 12, lightly-doped diffused regions 18 and heavily-doped diffused regions 19 which are formed in association with one another. An interlayer dielectric film (not shown) is deposited on the entire surface including the top of MISFETs, and a plurality of contact plugs (not shown) penetrating through the interlayer dielectric film are formed to connect together the heavily-doped diffused regions 19 and overlying interconnections not shown.

In a fabrication process of the semiconductor device 10, a thermal oxidation step is performed to form the silicon oxide film 13 having a thickness of 2 to 3 nm on the silicon substrate 11. Thereafter, using the ALD technique, the silicon nitride film 14 having a thickness of 1 to 2 nm is formed on the silicon oxide film 13. These steps provide the gate insulation film 12 having a two-layer structure.

Subsequently, a polysilicon film is formed on the gate insulation film 12. After boron ions are implanted into the polysilicon film, an anneal treatment is carried out to activate the implanted boron ions, thereby forming a boron-doped polysilicon film. Further, a silicon nitride film is deposited on the doped polysilicon film. Thereafter, using a well-known photolithographic technology, the silicon nitride film is patterned to configure the mask insulation film 16. Subsequently, by a dry etching technique using the mask insulation film 16 as an etching mask, the gate insulation film 12 and polysilicon film are subjected to patterning. The patterned polysilicon film configures the gate electrode 15.

Subsequently, a dopant is implanted into a surface portion of the silicon substrate 11 by using the gate electrode structure including the mask insulation film 16 as a mask, thereby forming the lightly-doped diffused regions 18 adjacent to the gate electrode 15 in a self-aligned process. Thereafter, a silicon nitride film is deposited on the entire surface of the silicon substrate. The silicon nitride film is then etched back to configure the sidewall insulation film 17 formed along the side surface of the gate insulation film 12, gate electrode 15 and mask insulation film 16.

Thereafter, a dopant is implanted into the surface portion of the silicon substrate 11 by using the mask insulation film 16 and sidewall insulation film 17 as a mask, thereby forming the heavily-doped diffused regions 19 in self-alignment with the sidewall insulation films 17 in a self-aligned process. After an interlayer dielectric film (not shown) is deposited to cover the MISFETs, a plurality of contact plugs (not shown) are formed, which penetrates the interlayer dielectric film so as to be connected to the heavily-doped diffused regions 19. Consequently, the semiconductor device 10 shown in FIG. 1 is obtained.

In the deposition of the silicon nitride film by using an ALD technique, a silicon nitride layer having a thickness of monoatomic level is deposited for a number of times so that a silicon nitride film having a desired thickness is finally obtained. The monoatomic-level silicon nitride layer is deposited for a number of repeated cycles each including the step of growing a silicon layer while supplying an Si-source gas and the step of nitriding the grown silicon layer while supplying an N-source gas, whereby the silicon nitride layer having the desired thickness is obtained. In an example of the present embodiment, a silicon layer having a thickness of 0.5 to 1.0 nm which is larger than the thickness of the monoatomic silicon layer is grown during the first silicon layer growing step. In the second and subsequent cycles, a silicon layer having a monoatomic-level thickness is deposited during the silicon layer growing step.

Figure 2A:
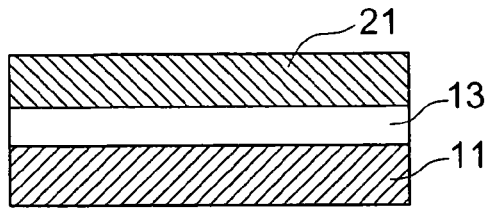
FIGS. 2A to 2D are sectional views of the semiconductor device of FIG. 1 during consecutive steps of fabrication thereof.
Figure 2B:
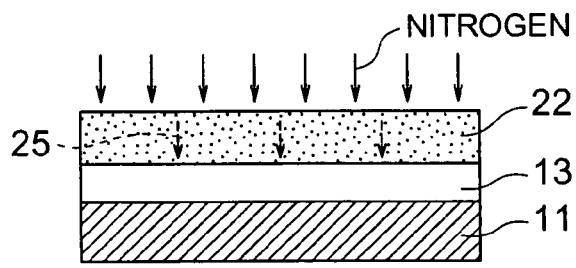

FIGS. 2A to 2D are sectional views showing the consecutive steps of forming the silicon nitride film. In the present embodiment, during the silicon layer growing step in the first cycle, the silicon layer 21 is grown to a thickness of at least 0.5 nm which is larger than the thickness of the monoatomic silicon layer, as shown in FIG. 2A. Therefore, during the following nitriding step, as shown in FIG. 2B, it is possible to prevent the silicon oxide film 13, which is likely to diffuse therein nitrogen, from being exposed directly to the nitrogen gas.

A silicon layer 21 formed on top of the silicon oxide film 13 or silicon nitride layer 22 formed by nitriding the silicon layer 21 hardly diffuses therein nitrogen gas. Therefore, it is possible to restrain the nitrogen from diffusing into the vicinity of the interface between the gate insulation film 12 and the silicon substrate 11. In FIG. 2B, the diffusion of nitrogen 25 is schematically illustrated.

Figure 2C:
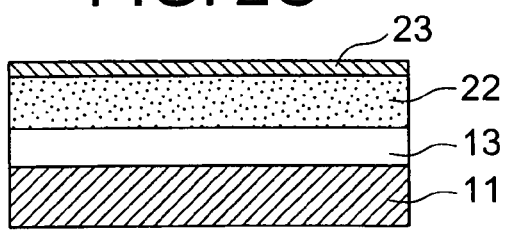
Figure 2D:
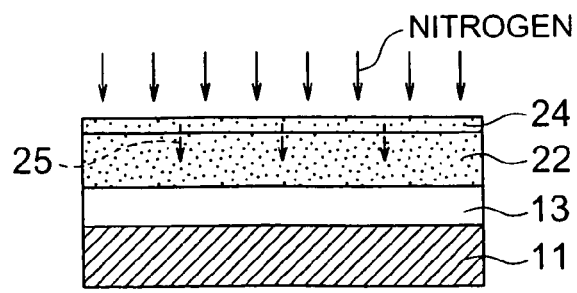

Since the silicon layer 21 is grown to a thickness within 1.0 nm in the first cycle, the silicon layer 21 can be sufficiently nitrided during the subsequent nitriding step. Further, in the silicon layer growing step in the second and subsequent cycles, the monoatomic silicon layer 23 is grown, as shown in FIG. 2C. Therefore, in the following nitriding step, the monoatomic silicon layer 23 can be nitrided with ease, as shown in FIG. 2D.

In the process of the present embodiment, since an Si-rich silicon nitride film 14 is by no means formed, the Si—N bonding strength in the silicon nitride film 14 can be enhanced to a sufficient extent, thereby suppressing the diffusion of boron. The effect of suppressing the diffusion of boron in the first cycle in the present embodiment is equivalent to the effect obtained in a method for growing the monoatomic silicon layer 23 in the first cycle.

Figure 3:
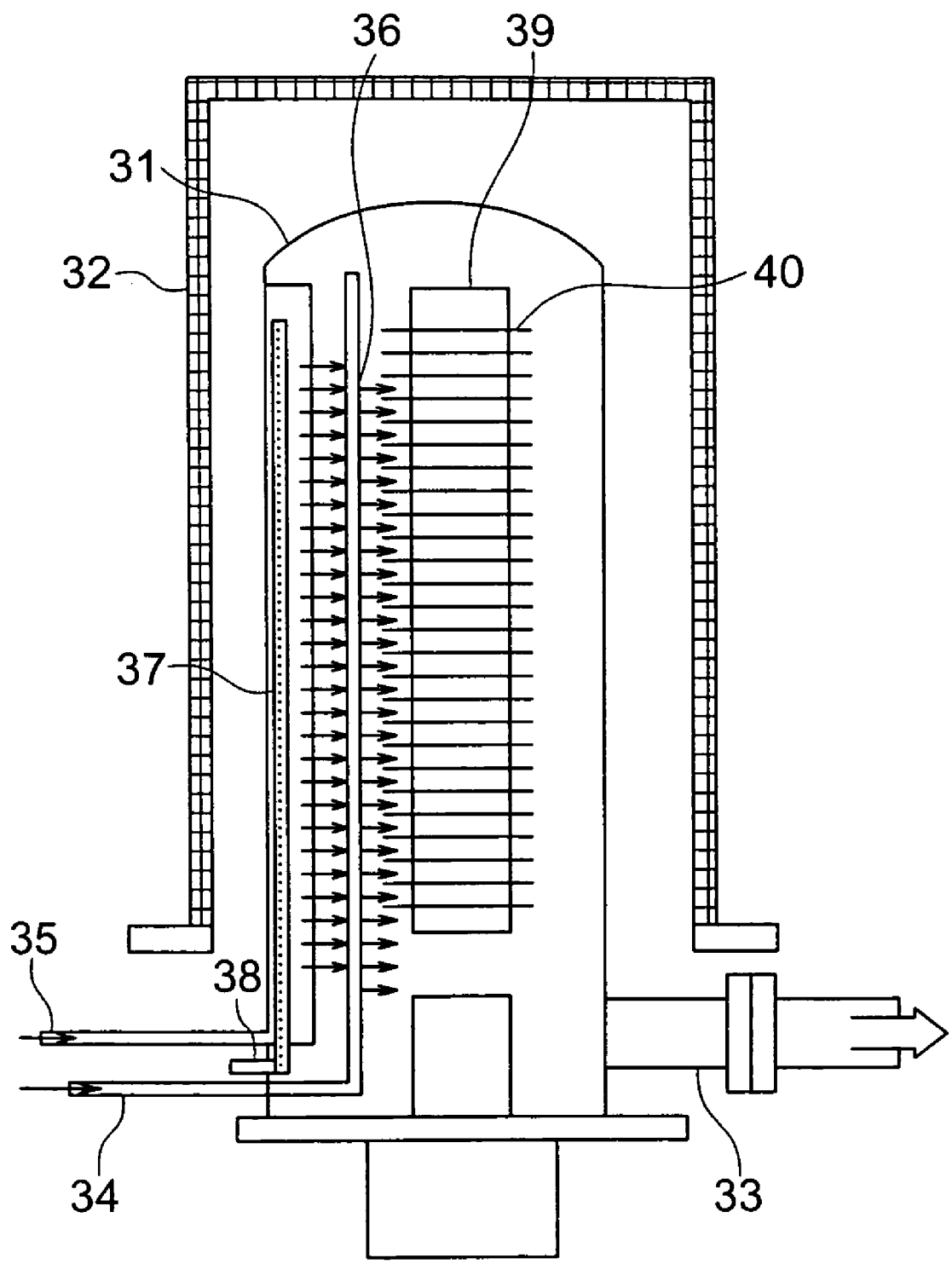
FIG. 3 is a sectional view of a deposition system used for forming the silicon nitride film in the semiconductor device of FIG. 1.

FIG. 3 is a sectional view showing the configuration of a deposition system for use in formation of the silicon nitride film 14 by using the ALD technique. The deposition system, generally designated at numeral 30, is a remote-plasma CVD system of a batch type and a vertical hot wall type. The deposition system 30 includes a processing cylinder 31, which is configured by quartz glass and has a closed top and an open bottom. A cylindrical heater 32 encircles the processing cylinder 31 to heat the interior of the processing cylinder 31. The cylindrical heater 32 is disposed concentrically with the processing cylinder 31.

The sidewall of the processing cylinder 31 is provided with an exhaust vent 33, which is communicated to an exhaust system (not shown). A slot valve (not shown) is disposed between the exhaust vent 33 and the exhaust system. In this configuration, the internal pressure of the processing cylinder 31 can be controlled as desired. A number of wafers 40, on each of which the semiconductor devices 10 are to be formed, are received in the processing cylinder 31 and arranged in the vertical direction on a wafer board 39. The wafer board 39 is moved to rise or fall in the vertical direction by an elevator (not shown), which is disposed in the vicinity of the bottom of the processing cylinder 31, whereby the wafers 40 are e introduced into or taken out of the processing cylinder 31.

Gas supply tubes 34 and 35 for supplying the Si-source gas and N-source gas, respectively, enter into the processing cylinder 31, and extend in the vertical direction within the processing tube 31 while opposing the edge of the wafers 40. A plurality of gas nozzles 36 are arrayed in the extending direction of the gas supply tubes 34 and 35. In the gas supply tube 35, a pair of electrodes 37 are arranged to oppose each other in order to ionize the N-source gas to generate plasma within the processing cylinder 31. The pair of electrodes 37 extend through the sidewall of the processing cylinder 31 toward the outside while being protected by protective tubes 38. A radio-frequency (RF) power source (not shown) is used for applying an RF power and connected to the pair of electrodes 37 via a matching impedance (not shown). Plasma is generated by applying the high-frequency electric power between the pair of electrodes 37 from the high-frequency power source.

The silicon nitride film 14 is formed at a controlled internal temperature of the processing cylinder 31 which is, for example, 550 degrees C. In the silicon layer growing step, $SiH_2Cl_2$ (dichlorosilane: DCS) is fed as an Si-source gas through the gas supply tube 34 at a flow rate of 0.65 slm (standard litter per minute). Further, in the nitriding step, $NH_3$ (ammonia) is fed as an N-source gas through the gas supply tube 35 at a flow rate of 6 slm. During the supply of $NH_3$, a radio-frequency electric power which is in the range of 150 to 400 W is applied between the pair of electrodes 37 so that $NH_3$ is ionized to generate plasma. Switching of the gas supply between the Si-source gas and the N-source gas is conducted while inserting a purge of the interior of the processing cylinder 31 by using an $N_2$ gas.

Figure 4A:
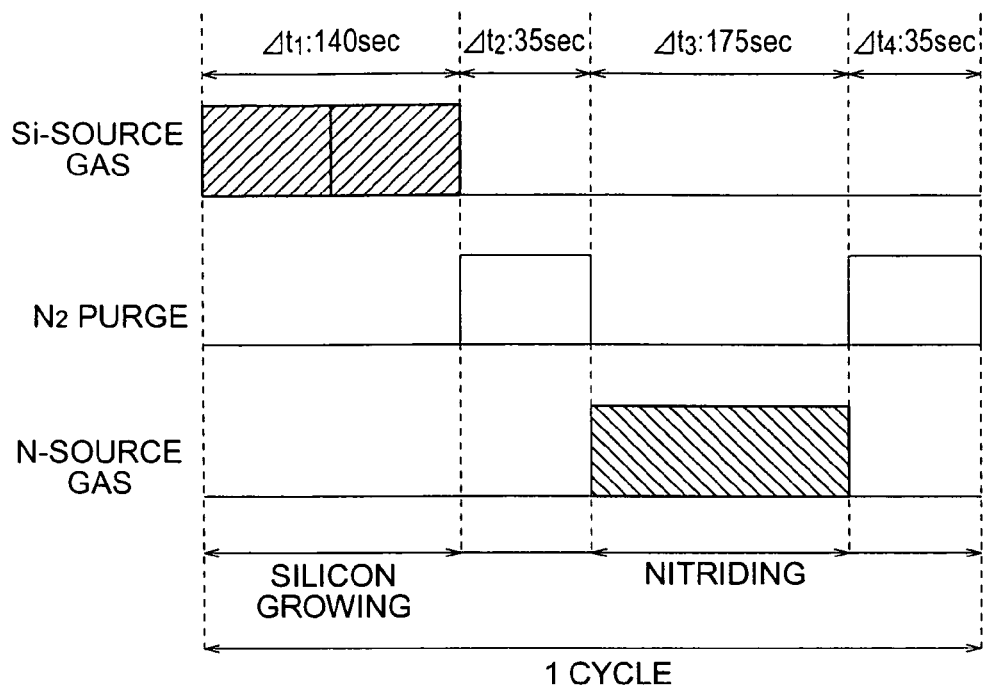
FIGS. 4A and 4B are a timing chart showing the process for forming the silicon nitride film according to an example of the embodiment.
Figure 4B:
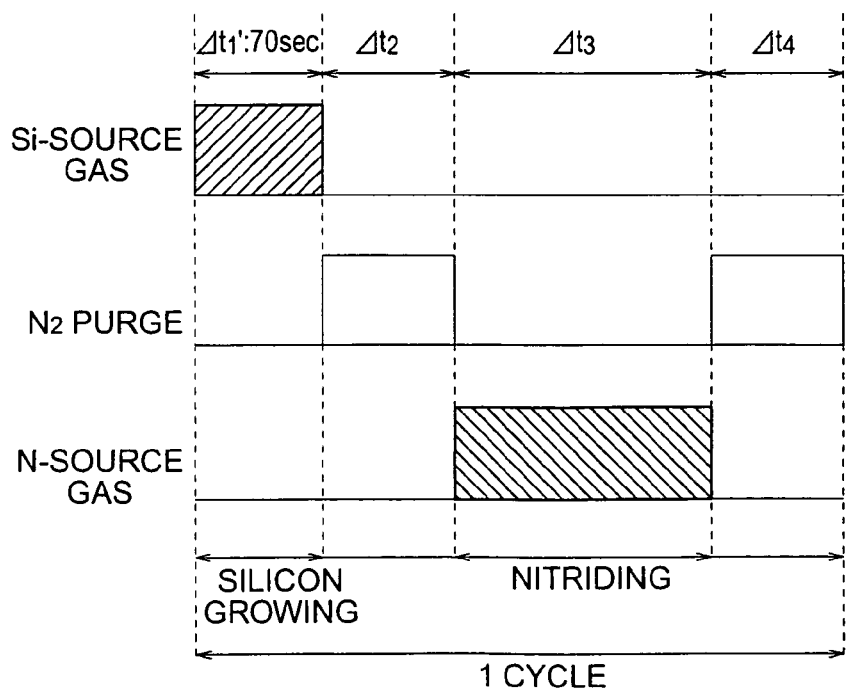

FIGS. 4A and 4B are timing charted showing the first cycle and the subsequent cycles, respectively. In the first cycle, as shown in FIG. 4A, the time length $\Delta t1$ of feeding the Si-source gas is set at 140 sec. In the subsequent cycles, as shown in FIG. 4B, the time length $\Delta t1'$ of feeding the Si-source gas is set at 70 sec. The time length $\Delta t3$ of feeding the N-source gas is set at 175 sec. in each of the first and subsequent cycles. The time lengths $\Delta t2$, $\Delta t4$ of purging using $N_2$ gas are set at 35 sec. in each of the cycles. In this way, the cycle is repeated for 12 times. After performing the process, a silicon nitride film 14 having a total thickness of 1 nm was formed.

According to the present embodiment, in the process for forming the silicon nitride film 14 by using the ALD technique, the silicon layer growing step in the first cycle provides a silicon layer 21 having a thickness of, for example, 0.5 nm, or thickness of 0.5 to 1.0 nm. Therefore, it is possible in the following nitriding step to prevent the exposure of the silicon oxide film 13, which is likely to diffuse therein nitrogen and to sufficiently nitride the silicon layer 21. As a result, the nitrogen is prevented from diffusing toward the vicinity of the interface between the silicon substrate 11 and the gate insulation film 12 while boron in the gate electrode 15 is prevented from diffusing toward the silicon substrate.

A semiconductor device of example-1 was manufactured using a process in accordance with the fabrication method of the present embodiment. Further, a semiconductor device of comparative example-1 was manufactured carrying out the first cycle of the ALD process of the silicon nitride film 14 in accordance with the time chart shown in FIG. 4B, wherein the time length $\Delta t1'$ for deposition of the monoatomic silicon layer in the first cycle is 70 sec. The thickness of the silicon oxide film 13 and the silicon nitride film 14 was set at about 3 nm and 1 nm, respectively.

Figure 5A:
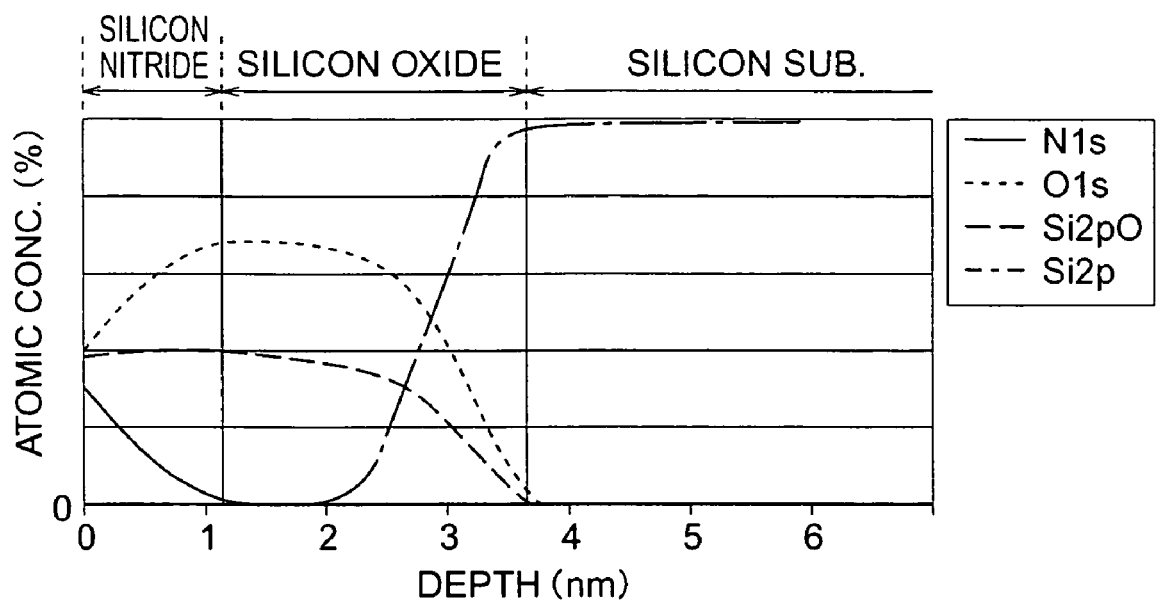
FIGS. 5A and 5B are a graph showing the profile of atomic concentration plotted against the depth of the location, in semiconductor devices obtained by the example and a comparative example.
Figure 5B:
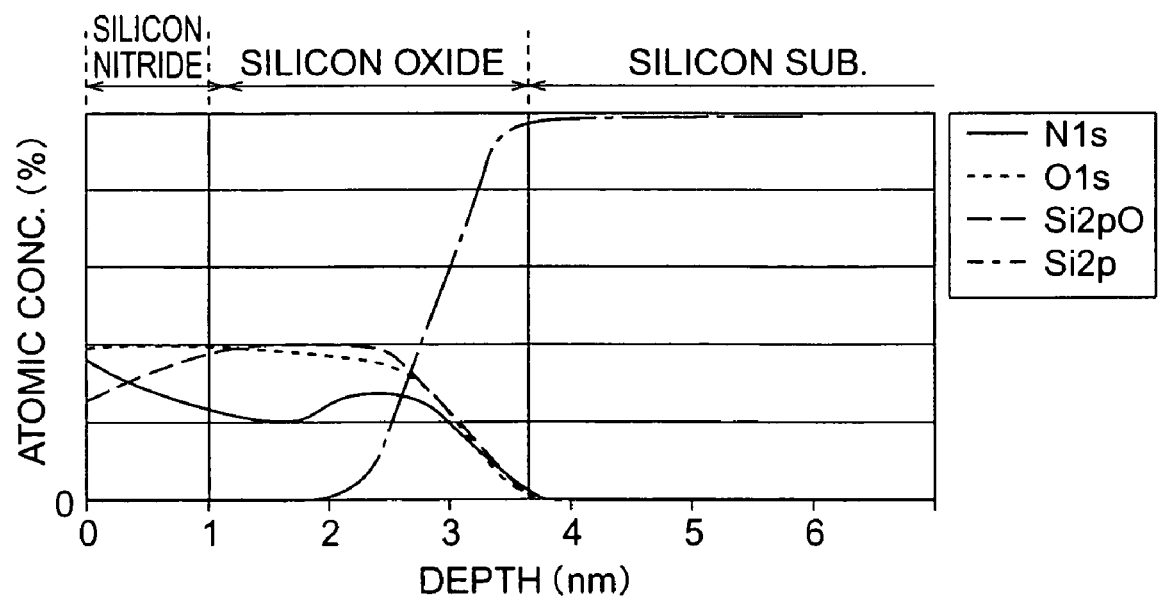

FIGS. 5A and 5B show an impurity concentration distribution of oxygen and nitrogen measured for the semiconductor devices of example-1 and comparative example-1, respectively, by using AR-XPS (angle-resolved X-ray photoelectron spectroscopy). In these figures, the relationship between the atomic percentage of the substances and the depth of each position is shown, with the depth of the each position being expressed by a deviation from the surface of the silicon nitride film 14, which is shown at 0 nm.

In the semiconductor device of comparative example-1, as shown n FIG. 5B, the nitrogen concentration is higher in the vicinity of the interface between the silicon substrate 11 and the silicon oxide film 13, whereas, in the semiconductor device in example-1, as shown in FIG. 5A, the nitrogen concentration in the relevant interface is almost at a background level. As described above, in the fabrication method of the present embodiment, it is possible to effectively suppress the diffusion of nitrogen toward the vicinity of the interface between the silicon substrate 11 and the silicon oxide film 13.

A semiconductor device of example-2 was manufactured in accordance with the fabrication method of the present embodiment. The thickness of the silicon oxide film 13 and the silicon nitride film 14 was set at about 3 nm and 1 nm, respectively. A semiconductor device of Comparative example-2 was manufactured such that a silicon oxide film acting as the gate insulation film 12 was formed to a thickness of 3 nm on the silicon substrate 11. In addition, a semiconductor device of Comparative example-3 was manufactured such that a silicon oxide film acting as the gate insulation film 12 was formed to a thickness of 3 nm on the silicon substrate 11 and was plasma-nitrided to configure a silicon oxynitride film.

In the semiconductor devices of example-2, Comparative examples-2 and -3, a polysilicon film configuring the gate electrode 15 was deposited to a thickness of 100 nm, and boron was ion-implanted into the polysilicon. The implanted boron was diffused by annealing (thermal treatment), to obtain a boron-doped polysilicon.

Figure 6:
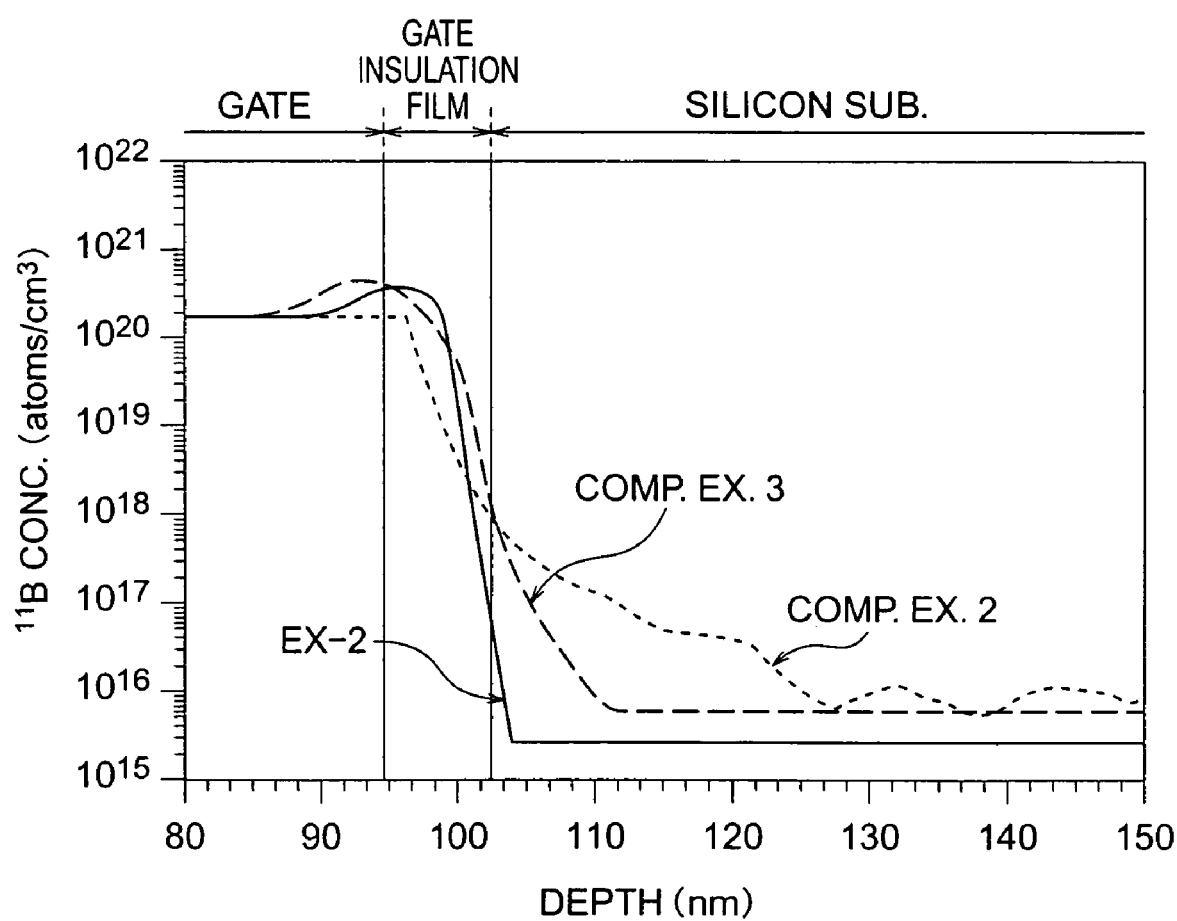
FIG. 6 is a graph showing the profile of boron concentration plotted against the depth of the location, in semiconductor devices obtained by the example and comparative examples.
Figure 7A:
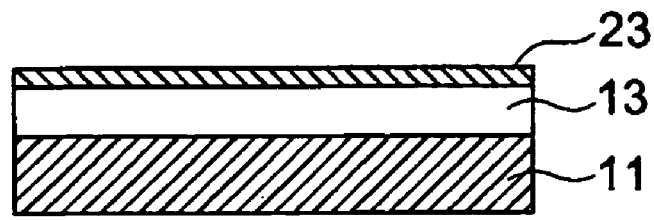
FIGS. 7A and 7B are sectional views showing consecutive steps of a conventional process for manufacturing a semiconductor device.
Figure 7B:
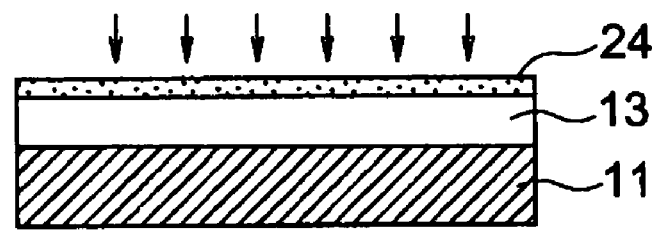
Figure 8:
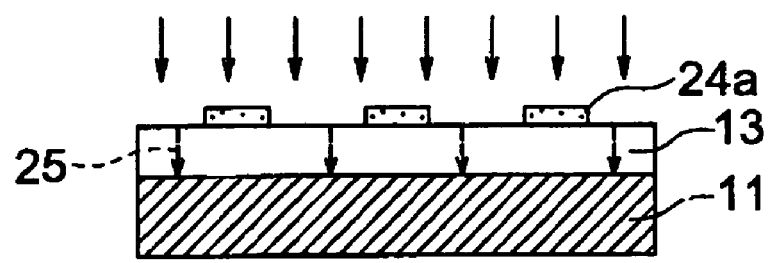
FIG. 8 is a sectional view showing a problem in the conventional process.

FIG. 6 shows a concentration distribution of boron in the semiconductor devices in example 2, comparative examples-2 and -3, showing a result measured by SIMS (secondary ion mass spectrometry). It is understood from the figure that the diffusion of the boron toward the silicon substrate 11 observed in the semiconductor device in example 2 is effectively suppressed as compared with comparative examples-2 and -3.

As described heretofore, the method of manufacturing a semiconductor device according to the present embodiment can effectively suppress the diffusion of boron in the diffused region of the semiconductor device.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising:
   forming a silicon oxide film on a silicon substrate; and
   forming a silicon nitride film on said silicon oxide film, wherein said silicon nitride film forming consecutively includes:
   a first step of growing a first silicon layer having a thickness larger than a thickness of a monoatomic silicon layer;
   a second step of nitriding said first silicon layer to form a first silicon nitride layer;
   a third step of growing a second silicon layer on said first silicon nitride layer, said second silicon layer having a thickness substantially equal to the thickness of the monoatomic silicon layer; and
   a fourth step of nitriding said second silicon layer to form a second silicon nitride layer.

2. The method according to claim 1, wherein said first silicon layer has a thickness of 0.5 to 1.0 nm.

3. The method according to claim 1, wherein a combination of said third step and said fourth step is performed for a plurality of times after said second step.

4. The method according to claim 1, wherein said first and third steps use $SiH_2Cl_2$ as a silicon source gas.

5. The method according to claim 1, wherein said second and fourth steps use $NH_3$ as a nitrogen source gas.

6. The method according to claim 1, wherein said growing said first silicon layer comprises growing said first silicon layer on said silicon oxide film.

7. The method according to claim 1, wherein said first silicon layer has a thickness of at least 0.5 nm.

8. The method according to claim 1, wherein said first silicon layer has a thickness of not greater than 1.0 nm.

9. The method according to claim 1, wherein said forming said silicon nitride film comprises a first time period including said growing said first silicon layer, a second time period including said nitriding said first silicon layer, and a third time period between said first and second time periods.

10. The method according to claim 9, wherein said second time period includes switching a gas supply between a silicon source gas used in said growing said first silicon layer and a nitrogen source gas used in said nitriding said first silicon layer.

11. The method according to claim 1, wherein said nitriding said first silicon layer comprises using a nitrogen source gas, said thickness of said first silicon layer being sufficient to prevent said silicon oxide film from being exposed to said nitrogen source gas.

12. The method according to claim 1, wherein said forming said silicon nitride film is performed in a processing cylinder, said growing said first silicon layer comprises feeding a silicon source gas to said processing cylinder for a first time period, and said growing said second silicon layer comprises feeding the silicon source gas to said processing cylinder for a second time period which is less than said first time period.

13. A method of manufacturing a semiconductor device comprising:
   forming a silicon oxide film on a silicon substrate; and
   forming a silicon nitride film on said silicon oxide film, comprising:
   growing a first silicon layer having a thickness greater than a thickness of a monatomic silicon layer;
   nitriding said first silicon layer to form a first silicon nitride layer;
   growing a second silicon layer on said first silicon nitride layer, said second silicon layer having a thickness substantially equal to the thickness of the monoatomic silicon layer; and
   nitriding said second silicon layer to form a second silicon nitride layer.

14. The method according to claim 13, wherein said growing said second silicon layer and said nitriding said second silicon layer are performed a plurality of times after said nitriding said first silicon layer,
   wherein said growing said first silicon layer and said growing said second silicon layer comprise using $SiH_2Cl_2$ as a silicon source gas, and wherein said nitriding said first silicon layer and nitriding said second silicon layer comprise using NH$_3$ as a nitrogen source gas.

15. The method according to claim 14, wherein said forming said silicon nitride film is performed in a processing cylinder and further comprises switching a gas supply between said silicon source gas and said nitrogen source gas while purging an interior of said processing cylinder by using a nitrogen gas.

16. A method of forming a silicon nitride film for a semiconductor device, the method comprising:

growing a first silicon layer having a thickness greater than a thickness of a monoatomic silicon layer;

nitriding said first silicon layer to form a first silicon nitride layer;

growing a second silicon layer on said first silicon nitride layer, said second silicon layer having a thickness substantially equal to the thickness of the monoatomic silicon layer; and nitriding said second silicon layer to form a second silicon nitride layer.

* * * * *